United States Patent
Tachizaki

(10) Patent No.: US 7,994,799 B2
(45) Date of Patent: Aug. 9, 2011

(54) INSULATION RESISTANCE DETECTION SYSTEM, INSULATION RESISTANCE DETECTION APPARATUS AND INSULATION RESISTANCE DETECTION METHOD

(75) Inventor: Shinsuke Tachizaki, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 430 days.

(21) Appl. No.: 12/318,996

(22) Filed: Jan. 14, 2009

(65) Prior Publication Data

US 2009/0134881 A1   May 28, 2009

Related U.S. Application Data

(63) Continuation-in-part of application No. PCT/JP2007/065565, filed on Aug. 2, 2007.

(30) Foreign Application Priority Data

Aug. 4, 2006   (JP) ................................ 2006-212787

(51) Int. Cl.
*H01H 31/12*   (2006.01)
(52) U.S. Cl. ...................................................... 324/551
(58) Field of Classification Search .................. 324/551, 324/691, 503, 705, 541, 509, 527, 519; 702/58; 340/647
See application file for complete search history.

(56) References Cited

U.S. PATENT DOCUMENTS

| 6,970,807 | B2 | 11/2005 | Kito et al. |
| 7,005,860 | B2 | 2/2006 | Yamamoto et al. |
| 7,012,435 | B2* | 3/2006 | Yamamoto et al. ........... 324/527 |
| 7,253,639 | B2* | 8/2007 | Horikoshi et al. ............ 324/551 |

FOREIGN PATENT DOCUMENTS

| JP | A-10-221395 | 8/1998 |
| JP | B2-2933490 | 8/1999 |
| JP | A-2003-255012 | 9/2003 |
| JP | A-2004-53367 | 2/2004 |
| JP | A-2004-354247 | 12/2004 |
| JP | A-2005-12858 | 1/2005 |
| JP | A-2004-347372 | 4/2005 |
| JP | A-2005-114496 | 4/2005 |
| JP | A-2005-127821 | 5/2005 |
| JP | A-2005-233822 | 9/2005 |

* cited by examiner

*Primary Examiner* — Huy Phan
*Assistant Examiner* — Tung X Nguyen
(74) *Attorney, Agent, or Firm* — Oliff & Berridge, PLC

(57) ABSTRACT

An insulation resistance determining system (50) comprises an insulation resistance determining portion configured by connecting a coupling capacitor (52), a detection resistor (54), and a pulse oscillating circuit (56) in series with a common mode potential measuring point (30), and an insulation resistance determining portion having a filter (58) which processes an AC signal ($v_x$) at a junction between the coupling capacitor (52) and the detection resistor (54), an amplifier (60), a wave-peak value detection circuit (62), and a controller (70). The controller (70) has functions for detecting a drop in insulation resistance in response to an output of the wave-peak value detection circuit (62); for requesting an HVCPU (40) to change the common mode potential so as to determine a failure of the insulation resistance determining portion; and for determining a failure of the insulation resistance determining portion from an output change of the wave-peak value determining circuit (62) between before and after the common mode potential change.

12 Claims, 3 Drawing Sheets

INSULATION RESISTANCE DETECTION SYSTEM, INSULATION RESISTANCE DETECTION APPARATUS AND INSULATION RESISTANCE DETECTION METHOD

TECHNICAL FIELD

The present invention relates to an insulation resistance detection system and apparatus and method. More particularly, the present invention relates to an insulation resistance detection system and apparatus, and the method employed by such for detecting, especially in vehicles, a drop in insulation resistance between a DC power supply and a vehicle body.

BACKGROUND ART

In vehicles with a power supply, when an insulation failure or the like occurs between a bus line either on a plus side or minus side of the power supply and a vehicle body, there is a risk that a so-called ground fault resulting in a leakage of power supply current to the vehicle body may occur. Thus, an insulation resistance detector is provided for detecting an insulation resistance between a DC power supply and a vehicle body. The insulation resistance detector is often referred to as an "insulation resistance drop detector" because the insulation resistance detector is used to detect a drop in insulation resistance. Further, when a failure occurs in the insulation resistance drop detector itself, it becomes impossible to detect the insulation resistance drop. Therefore, a failure of the insulation resistance drop detector itself is detected.

For example, Japanese patent publication JP 2005-114496 A discloses an insulation resistance drop detector for detecting a drop in insulation resistance of an insulating resistor $R_i$ between a DC power supply and a vehicle body (ground). The insulation resistance drop detector is configured to include a detecting resistor $R_d$ connected in series with the insulating resistor $R_i$, a coupling capacitor disposed between the insulating resistor $R_i$ and the detecting resistor $R_d$, a pulse oscillating circuit for applying a pulse signal to a series circuit including the insulating resistor $R_i$, the coupling capacitor, and the detecting resistor $R_d$, a filter for removing a signal component having a predetermined frequency from a voltage at a junction between the detecting resistor and the coupling capacitor, and a detector for detecting a drop in insulation resistance based on an output from the filter.

It should be noted that, in the above-noted patent document, a drop in insulation resistance is detected by observing changes of the frequency characteristic of the filter output while changing frequency of the pulse oscillating circuit. More specifically, when the coupling capacitor functions properly, the filter output shows a certain frequency characteristic. On the contrary, when the coupling capacitor is short-circuited, the filter output stays at a low level regardless of the frequency. On the other hand, when the coupling capacitor is opened, the filter output stays at a high level even with an increased frequency. The above patent document describes that these differences enable the detection of a failure of the insulation resistance drop detector.

Another patent document, Japanese patent publication JP 2004-354247A, points out that, with the prior art, it is difficult to detect an electrical leakage of a DC power supply to a vehicle body with a change of a common mode potential which is a potential of a battery terminal with respect to a vehicle body. It is noted that a vehicle impedance changes depending on whether a relay, which is provided between a battery and an inverter, is turned ON or OFF. When the relay is ON, the common mode voltage changes to low, while when the relay is OFF, the common mode voltage changes to high. It is disclosed to provide means for generating a pseudo electrical leakage so that it is possible to determine that an electrical leakage detecting device functions properly when the pseudo electrical leakage is detected. It is disclosed further that when an opening or closing of the relay is detected, the generation and detection of the pseudo electrical leakage are retried to avoid receiving effect of the change of the common mode potential.

DISCLOSURE OF THE INVENTION

The insulation resistance drop detector disclosed in JP 2005-114496A detects a failure of a detecting portion for detecting a drop in insulation resistance, more specifically, a failure of a coupling capacitor, based on a frequency characteristic of a filter output detected while changing frequency of a pulse oscillating circuit. It should be noted that because a filter includes electrical elements, the frequency characteristic of the filter output changes depending on the variation of the elements or temperature characteristic. Therefore, if these tolerances are considered, the detection may not be accurate because a failure of the detecting portion for detecting a drop in insulation resistance is detected depending on a change of the frequency characteristic of the filter output.

An advantage of the present invention is to provide an insulation resistance detection system and apparatus and method which enable an accurate detection of a failure of an insulation resistance drop detector itself.

An insulation resistance detection system according to one aspect of the present invention comprises an insulation resistance drop detecting portion comprising a detecting resistor connected in series with an insulating resistor between a DC power supply and a vehicle body, a coupling capacitor disposed between the insulating resistor and the detecting resistor, and a pulse oscillating circuit for applying a pulse signal to a series circuit including the insulating resistor, the coupling capacitor, and the detecting resistor; changing means for changing a common mode potential which is a potential at a junction between the insulating resistor and the coupling capacitor; a filter applied to a signal at a junction between the coupling capacitor and the detecting resistor to pass the signal within a predetermined frequency range; and failure determining means for determining a failure of the insulation resistance drop detecting portion based on a comparison result obtained by comparing a change of the filter-applied signal before and after the common mode potential is changed by the changing means.

In the insulation resistance detection system according to another aspect of the present invention, it is preferable that the changing means changes the common mode potential by turning an element disposed between the DC power supply and a rotating electric machine ON and OFF, or in accordance with a change in the operation status of the element during an ON period.

In the insulation resistance detection system according to another aspect of the present invention, it is preferable that the DC power supply is connected to a boost or back converter via a system main relay, while the boost or back converter is connected to an inverter which is connected to the rotating electric machine of the vehicle, and the changing means changes the common mode potential in accordance with a change in the operation status of the boost or back converter during an ON period by turning the converter ON and OFF.

In the insulation resistance detection system according to another aspect of the present invention, it is preferable that the pulse oscillating circuit provides an oscillation frequency less than 1/100 of an operating frequency of the boost converter and inverter, and the filter is a bandpass filter which passes a signal having the oscillation frequency of the pulse oscillating circuit and removes a signal having an operation frequency of the inverter and the boost converter.

With the above configuration, the insulation resistance detection system includes an insulation resistance drop detector for the insulating resistor between the DC power supply and the vehicle body. In the insulation resistance drop detector, the coupling capacitor, the detecting resistor, and the pulse oscillating circuit are connected in series. A signal at a junction between the coupling capacitor and the detecting resistor passes through a filter, and a signal passed through the filter with a predetermined frequency range is observed. The insulation resistance detection system determines a failure of the insulation resistance drop detector by comparing the signals passed through the filter before and after the common mode potential is changed by the changing means.

It should be noted that the signals after passing through the filter are observed before and after the common mode potential is changed. Therefore, an accurate detection of a failure of the insulation resistance drop detector can be achieved because the detection does not depend on a subtle characteristic change sensitive to the effect of variation of elements such as a change in frequency characteristic of the filter output.

Further, because the common mode potential is changed by turning an element disposed between the DC power supply and the rotating electric machine ON and OFF, or in accordance with a change in the operation status of the element during an ON period, the common mode potential can be easily changed by turning such element ON and OFF without requiring means specifically for changing the common mode.

The DC power supply is connected to the boost or back converter via a system main relay, while the boost or back converter is connected to the inverter connected to the rotating electric machine of the vehicle. The common mode potential may be changed in accordance with a change in the operation status of the converter during an ON period by turning the boost or back converter ON and OFF. If the common mode potential is changed by turning the system main relay ON and OFF, the common mode potential would change within a short time duration of the ON and OFF operation to cause a risk that the time duration would be too short to determine a failure by one ON and OFF operation alone. Further, if the common mode potential is changed by turning the inverter ON and OFF, the resulting voltage change would occur at high frequency. On the contrary, if the common mode potential is changed in accordance with a change in the operation status of the boost or back converter by turning the converter ON and OFF, the resulting voltage change would occur at low frequency. Therefore, it is preferable to change the common mode potential in accordance with a change in the operation status of the boost or back converter during an ON period by turning the converter ON and OFF.

The pulse oscillator circuit maintains an oscillation frequency of less than 1/100 of the operation frequency of the boost converter and inverter. The filter passes signals of the oscillation frequency of the pulse oscillator circuit while the filter removes signals of the operation frequency of the inverter and the boost or back converter. Therefore, the effect of the switching frequency caused from the operation of the boost converter can be reduced to enable an accurate determination of a failure of the insulation resistance drop detector.

BEST MODE FOR CARRYING OUT THE INVENTION

Preferred embodiments of the present invention are described in detail below with reference to the accompanying drawings. Although a hybrid vehicle having a motor/generator is described below as the vehicle to which an insulation resistance detection system is applied, the present invention may be employed with any vehicle having a power supply circuit including at least a DC power supply and a boost converter. Similarly, although the power supply circuit described below includes a DC power supply, a system main switch, a low-voltage side smoothing capacitor, a boost converter, a high-voltage side smoothing capacitor, and an inverter, the power circuit may include components other than the above, other components may be used in place of a portion of the above components, or some portion of the above components may be omitted entirely. For example, a bi-directional converter, which functions both as a boost converter and a back converter, may be used in place of the boost converter. Additionally, the boost or back converter can be also referred to as a "DC/DC converter" because the converter is used to convert a DC voltage.

Figure 1:
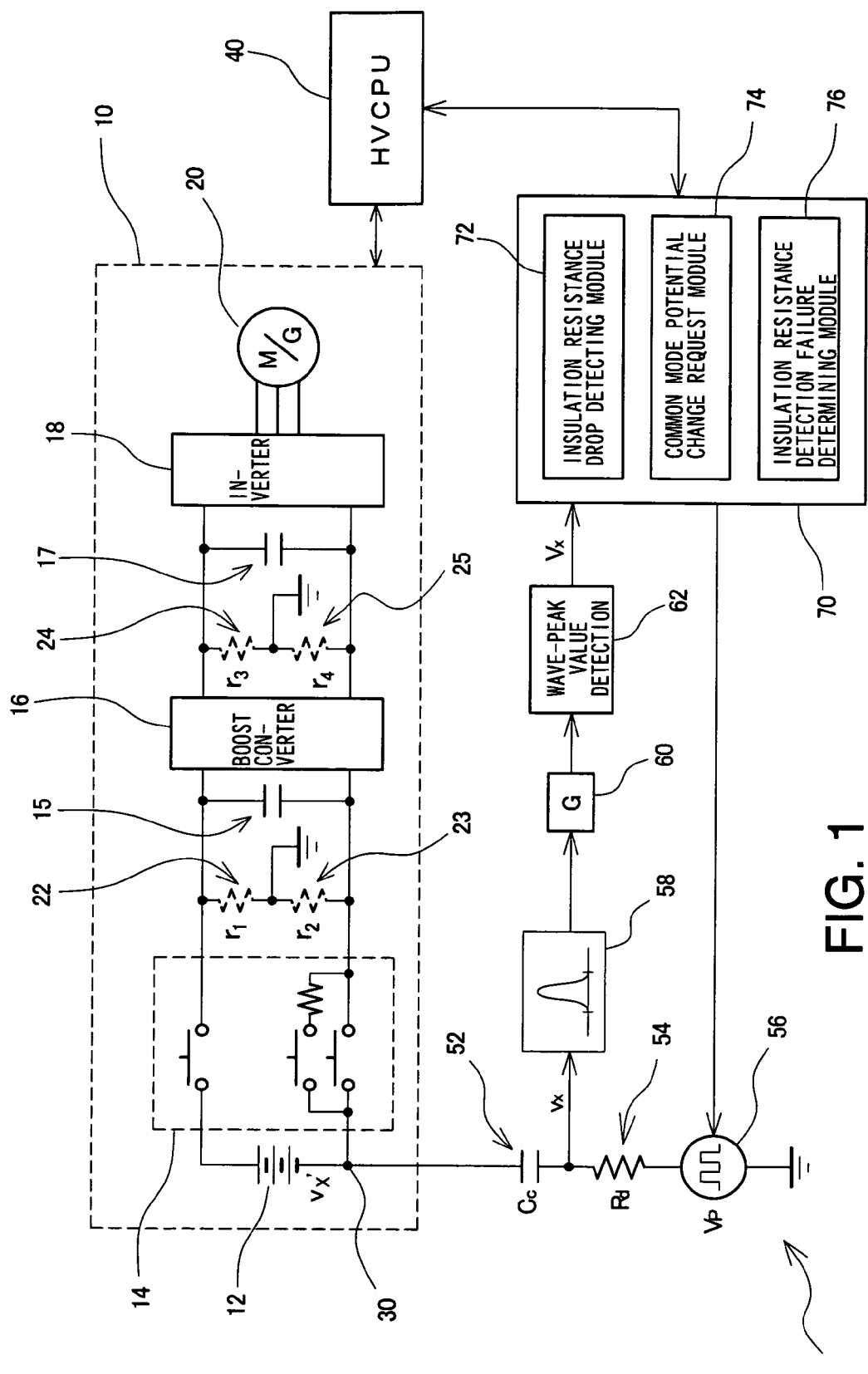
FIG. 1 is a diagram in which an insulation resistance detection system according to one embodiment of the present invention is applied to a hybrid vehicle.

FIG. 1 is a configuration diagram showing an insulation resistance detection system 50 in a hybrid vehicle. FIG. 1 shows a motor/generator driver 10 of the hybrid vehicle and a hybrid CPU (HVCPU) 40 for controlling overall operation of the hybrid vehicle, both of which are not the components of the insulation resistance detection system 50. The HVCPU 40 is connected to the motor/generator driver 10 and the insulation resistance detection system 50 for controlling the operation of these components.

The motor/generator driver 10 of the hybrid vehicle is configured to include a DC power supply 12, a system main relay (SMR) 14, a low-voltage side smoothing capacitor 15, a boost 20, converter 16, a high-voltage side smoothing capacitor 17, an inverter 18, and a motor/generator 20. With this configuration, when the motor/generator is driven as a motor, a DC voltage from the DC power supply 12 is boosted to a high DC voltage by the boost converter 16 and the boosted voltage is supplied to the motor/generator 20 after the voltage is converted to a three-phase drive signal by the inverter 18. When the motor/generator functions as a power generator, its regenerated energy is stored in the high-voltage side smoothing capacitor 17 or the like by the inverter 18. For example, a voltage from the DC power supply 12 may be about 150 V and boosted to about 300 V by the boost converter 16.

A vehicle body is connected to ground in a vehicle system. However, bus lines on the plus and the minus sides of the DC power supply 12 are not connected to the vehicle body. Thus, the potential of these lines is in a "floating state" to the vehicle body. Similarly, regarding the boost converter 16 and the inverter 18, the bus lines on the plus and the minus sides of these components are not connected to the vehicle body and thus the potential of these lines is also in the "floating state" in relation to the vehicle body. In this way, the vehicle, which is indicated as a ground sign in FIG. 1, is insulated from these bus lines. The insulation is provided by insulating resistors 22, 23, 24, 25.

The potential of these bus lines insulated from the ground is generally called "common mode potential". In FIG. 1, a measurement point 30 of the common mode potential $v_x'$ is shown on a bus line on the minus side of the DC power supply 12. When the insulating resistors 22, 23, 24, 25 function properly, the common mode potential $v_x'$ at the measurement point 30 is floating from a ground potential. However, when the insulating resistors 22, 23, 24, 25 show 0Ω for some reason, that is, when they are short-circuited with the ground, the common mode potential becomes 0 V.

The insulation resistance detection system 50 does not directly measure the common mode potential $v_x'$, but functions as an insulation resistance drop detector which detects whether the resistance of the insulating resistors 22, 23, 24, 25 is normal or lower than the normal range. The insulation resistance detection system 50 also has a function to determine whether or not a failure occurs in the insulation resistance drop detector.

The insulation resistance detection system 50 can be broadly divided into the insulation resistance detecting portion connected to the measurement point 30 of the common mode potential $v_x'$ for detecting an insulation resistance drop and an insulation resistance determining portion which processes a signal from the insulation resistance detecting portion to detect the insulation resistance drop and further to determine the presence or absence of a failure of the insulation resistance detecting portion.

The insulation resistance detecting portion is configured to include a coupling capacitor ($C_c$) 52, a detecting resistor ($R_d$) 54, and a pulse oscillating circuit ($V_p$) 56, all of which are connected in series. One end of the coupling capacitor 52 which is at one end of the above components connected in series is connected to the measurement point 30 of the common mode potential $v_x'$, while one end of the pulse oscillating circuit 56 which is at the other end of the above components connected in series is connected to the ground. More specifically, in this configuration, the detecting resistor 54 is connected in series with the insulating resistors 22, 23, 24, 25, and the coupling capacitor 52 is disposed between the detecting resistor 54 and the insulating resistors 22, 23, 24, 25, and the pulse oscillating circuit 56 applies a pulse signal to the series circuit including the insulating resistors 22, 23, 24, 25, the coupling capacitor 52, and the detecting resistor 54.

The coupling capacitor 52 has a DC blocking function. The coupling capacitor 52 functions to block a DC component of the common mode potential at the measurement point 30 such that the DC component does not reach the detecting resistor 54, while the coupling capacitor 52 functions to pass an AC signal from the pulse oscillating circuit 56 to the insulating resistors 22, 23, 24, via the measurement point 30 and the bus line. In other words, the insulating resistors 22, 23, 24, 25 and the detecting resistor 54 are connected in series for passing AC signals via the coupling capacitor 52.

The detecting resistor 54 is a resistor element which is connected with the insulating resistors 22, 23, 24, 25 in series to pass AC signals as described above for relatively detecting resistance of the insulating resistors 22, 23, 24, 25.

The pulse oscillating circuit 56 is used to apply AC signals to the insulating resistors 22, 23, 24, 25, and the detecting resistor 54 which are connected in series for passing AC signals. This configuration enables a function to output AC signals $v_x$ at a junction for passing AC signals between the insulating resistors 22, 23, 24, 25 and the detecting resistor 54, that is at the junction between the coupling capacitor 52 and the detecting resistor 54 in such a manner that the voltage of the AC signals are divided in accordance with a relative magnitude between the insulating resistors 22, 23, 24, 25 and the detecting resistor 54.

The frequency of the pulse signals from the pulse oscillating circuit 56 closely relates to a frequency band of the signals used for subsequent measurement of a drop in insulation resistance and determining a failure of the detector. Therefore, it is preferable that the frequency of the pulse signals does not match with the frequency band of the switching signals used by the motor/generator driver 10. In this way, noise can be removed and an accurate measurement can be assured accordingly. For example, when the switching frequency of the boost converter 16 is about 5 kHz to 10 kHz while the switching frequency of the inverter 18 is about 5 kHz, it is preferable to set the oscillation frequency of the pulse oscillating circuit 56, that is the frequency of pulse signals, to be about two or three digits lower frequency than these frequencies. More specifically, in the above example with switching frequencies of about 5 kHz to 10 kHz, it is preferable to set the oscillation frequency to be less than about 50 Hz to 5 Hz which is a 1/100 to 1/1000 low frequency. Therefore, for example, a rectangular pulse of 2.5 Hz may be used as the pulse signal of the pulse oscillating circuit 56. A wavepeak value of the pulse signal, that is a peak-to-peak value may be a value sufficient for measurement, for example, 5 $V_{pp}$.

The insulation resistance determining portion is configured, in order to process AC signals, to include a filter 58, an amplifier 60, a wave-peak value detecting circuit 62, and a controller 70.

The filter 58 has a function to selectively pass a frequency component of the AC signals $v_x$ in such a manner that only the frequency component same as the pulse signals from the pulse oscillating circuit 56 is passed. In other words, the filter 58 passes signals having the oscillation frequency same as the pulse oscillating circuit 56, while the filter 58 functions as a band-pass filter to remove signals of the operation frequency of the inverter 18 and the boost converter 16. In the above example, a band-pass filter with a central frequency of 2.5 Hz may be used.

With the filter 58 having the band characteristic as shown above, a ratio of the resistances between the insulating resistors 22, 23, 24, 25 and the detecting resistor 54 can be accurately determined. In other words, the pulse oscillating circuit 56 applies pulse signals to the series circuit including the insulating resistors 22, 23, 24, 25, the coupling capacitor 52, and the detecting resistor 54 to obtain responding AC signals $v_x$ which include information regarding a relative magnitude between the insulating resistors 22, 23, 24, 25 and the detecting resistor 54. As shown above, by setting the band characteristic of the filter 58 to match with the oscillation frequency of the pulse oscillating circuit 56, it is possible to extract, from the frequency components of the AC signals $v_x$, the oscillation frequency components of the pulse oscillating circuit 56 which are applied to obtain information about the relative magnitude between the insulating resistors 22, 23, 24, 25 and the detecting resistor 54. Therefore, because it is possible to extract a response for a signal which is applied specifically for performing the determination, the accuracy of the determination is improved. In the above example, the frequency components of 2.5 Hz in the AC signals $v_x$ are extracted.

The amplifier 60 functions to appropriately amplify the signals to which filtering process has been applied. In the above example, the amplitude of a 2.5 Hz signal is appropriately amplified. The wave-peak value detecting circuit 62 detects an output $V_x$ which is a wave-peak value of the amplified AC signal. In the above example, the wave-peak value, that is a peak-to-peak value, of appropriately amplified 2.5 Hz signal is detected.

The controller 70 integrally controls individual elements in the insulation resistance detection system 50 to detect a drop in insulation resistance in order to determine a failure of the insulation resistance detecting portion. The controller 70 is configured to include an insulation resistance drop detecting module 72 for specifying oscillation conditions to the pulse oscillating circuit 56 and for detecting a drop in insulation resistance based on a value detected by the wave-peak value detecting circuit 62, a common mode potential change request module 74 for requesting a change in the common mode potential to the HVCPU 40 in order to enable the determination of a failure of the insulation resistance detecting portion, and an insulation resistance detection failure determining module 76 for determining a failure of the insulation resistance determining portion based on a change in the output from the wave-peak value detecting circuit 62 by comparing the outputs before and after the common mode potential is changed.

The above-described functions of the controller 70 may be achieved by software. More specifically, the functions may be obtained by performing a corresponding program for detecting the insulation resistance. Therefore, the controller 70 may be configured using an appropriate computer. It is also possible to implement the functions in other controller mounted in the vehicle. For example, the functions of the controller 70 may be implemented as functions of the HVCPU 40. It should be noted that some or all of the functions may be configured through hardware.

Figure 2:
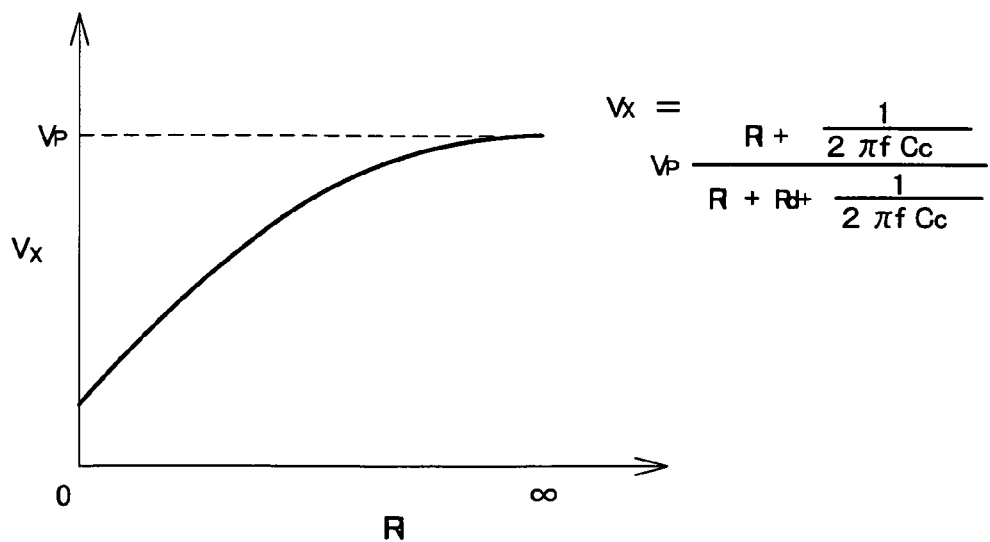
FIG. 2 is a graph showing a principle for detecting an insulation resistance according to one embodiment of the present invention.
Figure 3:
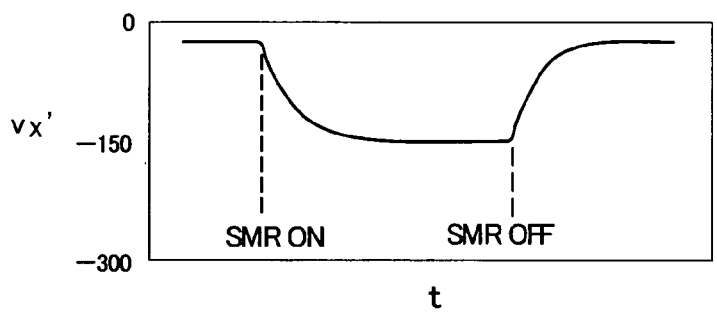
FIG. 3 is a graph showing a change of a common mode potential caused, for one example, by turning a system main relay (SMR) ON and OFF in accordance with one embodiment of the present invention.
Figure 4:
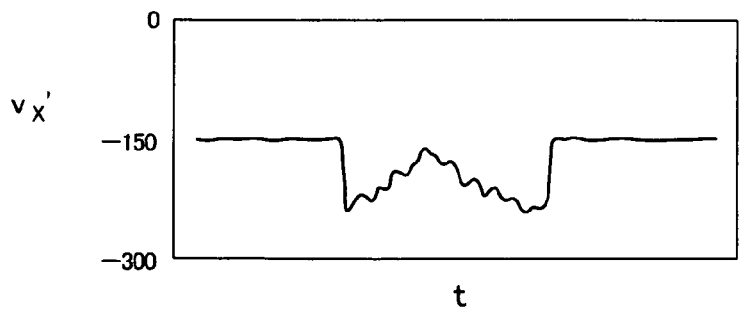
FIG. 4 is a graph showing a change of a common mode potential caused, for another example, by turning a boost converter ON and OFF in accordance with one embodiment of the present invention.
Figure 5:
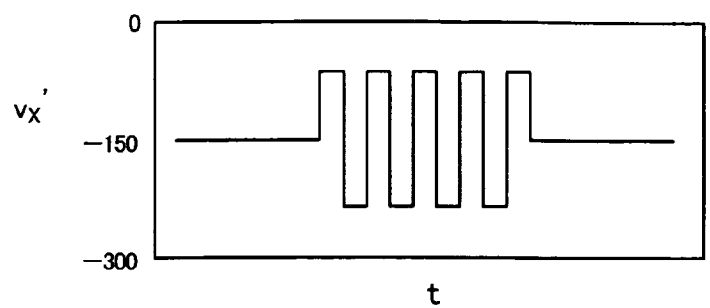
FIG. 5 is a graph showing a change of a common mode potential caused, for one another example, by turning an inverter ON and OFF in accordance with one embodiment of the present invention.
Figure 6:
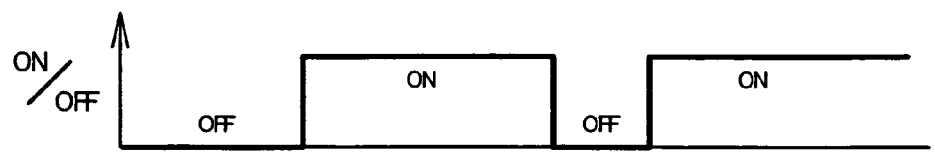
FIG. 6 is a graph showing ON and OFF timings of a boost converter for determining a failure of an insulation resistance detector by turning the boost converter ON and OFF in accordance with one embodiment of the present invention.
Figure 7:
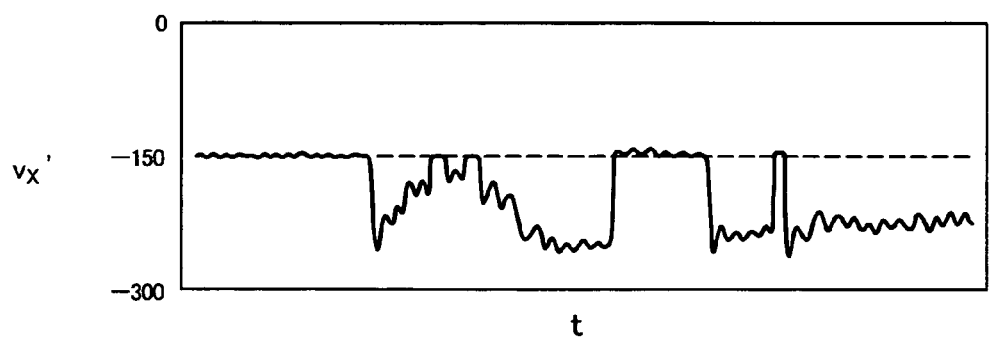
FIG. 7 is a graph showing changes of a common mode potential $v_x'$ in relation to FIG. 6.
Figure 8:
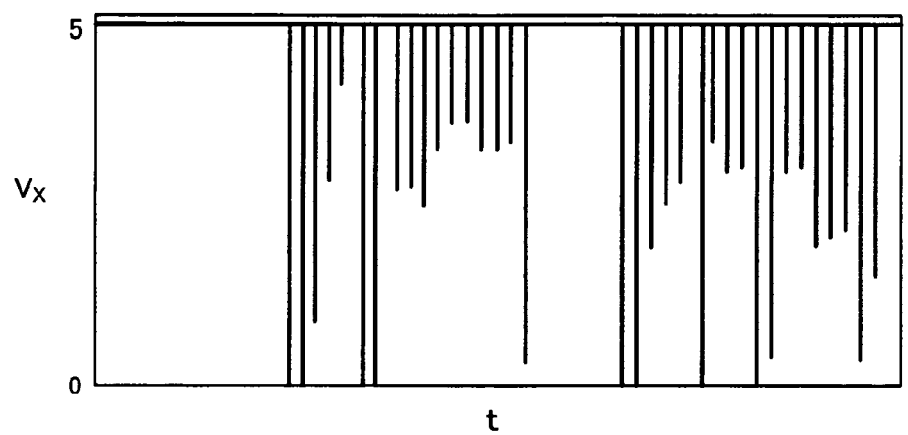
FIG. 8 is a graph showing changes of an output $V_x$ of a wave-peak value detector in relation to FIGS. 6 and 7.

With reference to FIGS. 2 to 8, the effects of the above configurations, especially, the contents of each function of the controller 70 are described in detail below. FIG. 2 is a graph showing a principle for detecting an insulation resistance. FIGS. 3 to 5 are graphs showing an example of a change in a common mode potential. FIGS. 6 to 8 shows manners for detecting a failure of the insulation resistance detecting portion by turning the boost converter 16 ON and OFF.

A drop in insulation resistance is detected based on the output from the wave-peak value detecting circuit 62. As explained above, a pulse signal is applied to the series circuit including the insulating resistors 22, 23, 24, 25, the coupling capacitor 52, and the detecting resistor 54 by the pulse oscillating circuit 56, at which time an AC signal $v_x$ appeared at the junction between the coupling capacitor 52 and the detecting resistor 54 includes information regarding a relative magnitude between the insulating resistors 22, 23, 24, 25 and the detecting resistor 54. The AC signal $v_x$ includes various frequency components. Thus, the signal having the frequency components in the frequency band same as the pulse signal applied by the pulse oscillating circuit 56 is extracted by the filter 58. The extracted signal is amplified to a sufficient amplitude by the amplifier 60. Then, the wave-peak value of the signal is detected by the wave-peak value detecting circuit 62.

As explained above, the insulating resistors 22, 23, 24, 25, the detecting resistor 54, and the coupling capacitor 52 are connected in series for passing AC signals. The magnitude of the total insulation resistance $R_i$ is expressed as $R_i = 1/\{(1/r_1)+(1/r_2)+(1/r_3)+(1/r_4)\}$, where symbols "$r_1$", "$r_2$", "$r_3$", and "$r_4$" indicate an insulation resistance of the insulating resistors 22, 23, 24, 25 respectively. The output $V_x$ of the wave-peak value detecting circuit 62 is expressed as $V_x = V_p[\{R_i + (1/<2\pi f C_c>)\}/\{R_i + R_d + (1/<2\pi f C_c>)\}]$, where the symbol "$R_d$" indicates the magnitude of the detected resistance; "$C_c$" indicates the capacitance value of the coupling capacitor 52; "f" indicates a signal frequency; "$V_p$" indicates the wave-peak value of the pulse signal applied by the pulse oscillating circuit 56. In other words, when the insulation resistance $R_i$ shows a normal infinity value, the output $V_x$ is expressed as $V_x = V_p$, while when the insulation resistance $R_i$ drops from the infinity value, $V_x$ becomes smaller than $V_p$ accordingly. In a case where the bus line of the DC power supply and the vehicle body are short-circuited, the insulation resistance $R_i$ becomes zero, resulting in $V_x = V_p[\{1/<2\pi f C_c>\}/\{R_d + (1/<2\pi f C_c>)\}]$ FIG. 2 illustrates the above situation. The horizontal axis of FIG. 2 shows a magnitude of the insulation resistance $R_i$ while the vertical axis shows an output of the wave-peak value detecting circuit 62. As shown in the drawing, when the insulation resistance $R_i$ is at infinity, the output can be expressed as $V_x = V_p$, while when the insulation resistance $R_i$ drops from infinity, $V_x$ becomes smaller than the $V_p$ accordingly. When the insulation resistance $R_i$ is zero, $V_x = V_p[\{1/<2\pi f C_c>\}/\{R_d + (1/<2\pi f C_c>)\}]$.

As explained above, a pulse signal is applied by the pulse oscillating circuit 56 to the series circuit including the insulating resistors 22, 23, 24, 25, the coupling capacitor 52, and the detecting resistor 54 (pulse signal applying process), and the AC signal $v_x$ appearing at the time at the junction between the coupling capacitor 52 and the detecting resistor 54 is processed by the filter 58 (signal processing process). Then, the processed signal can be converted to a value corresponding to the magnitude of the insulation resistance $R_i$ by observing the output $V_x$ from the wave-peak value detecting circuit 62 (insulation resistance converting process). The insulation resistance drop detecting module 72 of the controller 70 issues an instruction to the pulse oscillating circuit 56 to output a pulse signal, at which time the insulation resistance drop detecting module 72 performs detection of the magnitude of the insulation resistance $R_i$ based on the output $V_x$ of the wave-peak value detecting circuit 62 in accordance with the above formula.

An operation of determining a failure of the insulation resistance drop detecting portion or the like is explained below. A failure is determined based on whether or not the output from the wave-peak value detecting circuit 62 changes by comparing the output before and after the common mode potential at the motor/generator driver 10 is changed. More specifically, because the AC signal $v_x$ changes in response to a change of the common mode potential, the output from the wave-peak value detecting circuit 62 should change accordingly when the insulation resistance detecting portion and the insulation resistance determining portion are normally functioning. On the contrary, when a failure occurs, more specifically when an open failure occurs, in the coupling capacitor 52, the AC signal $v_x$ does not change even when the common mode potential is changed. Therefore, it is possible to determine the presence or absence of a failure of the insulation resistance detecting portion or the like based on whether or not the output $V_x$ from the wave-peak value detecting circuit 62 changes before and after the common mode potential is changed.

The common mode potential at the motor/generator driver 10 is a potential of the bus line of the DC power supply, that is a floating potential from the ground as explained above. Therefore, the common mode potential changes by turning each element of the motor/generator driver 10 ON and OFF, or in accordance with a change in the operation status of the element during an ON period. FIGS. 3 to 5 illustrate such a situation. In each of these drawings, the horizontal axis shows time while the vertical axis shows a voltage. These drawings show changes of the common mode potential over time. FIG. 3 shows a case where the system main relay (SMR) 14 illustrated in FIG. 1 is turned ON and OFF; FIG. 4 shows a case where the boost converter 16 is turned ON and OFF; and FIG. 5 shows a case where the inverter 18 is turned ON and OFF.

As shown in FIG. 3, the common mode change caused by turning the system main relay (SMR) ON and OFF is detectable in a short transition time duration in which the system main relay is turned ON or OFF. However, in order to reliably detect a change of the common mode potential which occurs in the short-time during one ON and OFF, the output from the wave-peak value detecting circuit 62 should be carefully processed.

FIG. 4 shows changes of the common mode potential caused by turning the boost converter ON and OFF, while FIG. 5 shows changes of the common mode potential caused by turning the inverter ON and OFF. In both cases, the changes occur when each of the elements is ON. Therefore, the changes of the common mode potential can be reliably detected by maintaining a sufficiently long ON period. In comparing FIGS. 4 and 5, the change of the common mode voltage caused by the activation of the boost converter is in low frequency, while the change of the common mode voltage caused by the activation of the inverter is in high frequency. Therefore, it is preferable to change the common mode potential in accordance with a change in the operation status of the boost converter during an ON period by turning the boost converter ON and OFF.

FIGS. 6 to 8 show a change of the output from the wave-peak value detecting portion according to changing the common mode potential in accordance with a change in the operation status of the boost converter during an ON period by turning the boost converter ON and OFF. The common mode potential is changed in accordance with a change in the operation status of the boost converter during an ON period by turning the boost converter ON and OFF by using a function of the common mode potential change request module 74 of the controller 70 shown in FIG. 1 to turn the boost converter ON and OFF via the HVCPU 40. FIG. 6 shows timings of ON and OFF of the boost converter. Corresponding to these timings, FIG. 7 illustrates the changes of the common mode potential $v_x'$, while FIG. 8 shows the changes of the output $V_x$ from the wave-peak value detecting portion. In these drawings, the horizontal axis shows time with a point of origin starting at the same time, while the vertical axis shows an ON or OFF status in FIG. 6 and a voltage in FIGS. 7 and 8.

As shown in FIGS. 6 and 7, with the boost converter turned OFF, the common mode potential $v_x'$ shows a substantially stable value around −150 V where a pulse signal having 5 $V_{pp}$ is superimposed. On the other hand, with the boost converter turned ON, the AC signal $v_x$ becomes equal to the change of the common mode potential illustrated in FIG. 4 plus superimposed pulse signal having 5 $V_{pp}$.

The AC signal $v_x$ shown in FIG. 7 is a signal in which a DC component was removed from the common mode potential $v_x'$ by a function of the coupling capacitor 52. The AC signal $v_x$ is processed by functions of the filter 58, the amplifier 60, and the wave-peak value detecting circuit 62 to extract a component of oscillation frequency of the pulse oscillating circuit 56, that is, only the component of 2.5 Hz is extracted. The extracted component is amplified to an appropriate amplitude. FIG. 8 shows the amplified component as the output $V_x$ from the wave-peak value detecting circuit 62. It should be noted that the amplifier 60 is adjusted such that the wave-peak value of the output $V_x$ from the wave-peak value detecting circuit 62 is 5 V. As it is apparent by comparing FIGS. 6, 7, and 8, the output $V_x$ from the wave-peak value detecting circuit 62 is +5 V with the boost converter turned OFF, while with the boost converter turned ON, the output $V_x$ changes between 0 V and +5 V in accordance with the change of the common mode potential. The interval between the changes equals to the frequency of the pulse signal, that is 2.5 Hz in the above example. As such, the output $V_x$ from the wave-peak value detecting circuit 62 becomes significantly different depending on whether the boost converter is turned ON or OFF.

FIGS. 6 to 8 show an example when each element of the insulation resistance detecting portion functions properly. When an open failure occurs in one of the elements in the insulation resistance detecting portion, for example, the coupling capacitor 52 in FIG. 1, the AC signal $v_x$ shown in FIG. 7 does not change in accordance with ON and OFF state of the boost converter, because an electric current does not flow through the coupling capacitor 52 even when the common mode potential is changed. Accordingly, the output $V_x$ from the wave-peak detecting portion shown in FIG. 8 does not change in accordance with the ON and OFF of the boost converter, but stays at the same wave-peak value. Therefore, when a failure occurs in the coupling capacitor 52, the output $V_x$ from the wave-peak value detecting portion does not change before and after the boost converter is turned ON and OFF, but stays at the same wave-peak value. This phenomenon does not depend on the frequency characteristic of the filter 58 illustrated in FIG. 1. In other words, it is possible to accurately determine the presence or absence of an open failure of the coupling capacitor 52 by comparing the outputs $V_x$ of the wave-peak value detecting portion before and after the boost converter is turned ON and OFF without depending on the frequency characteristic of the filter 58 which is easily affected by the variation of the elements or temperature characteristic.

The above-explained determination of a failure of an element such as an insulation resistance detecting portion is performed by each function of the controller 70 illustrated in FIG. 1 in the processing processes below. First, the pulse oscillating circuit 56 outputs a predetermined pulse signal to cause the wave-peak value detecting circuit 62 to output $V_x$. This procedure is performed by a function of the insulation resistance drop detecting module 72 similarly as in the case of a general insulation resistance drop detection. Second, while detecting the insulation resistance drop, the boost converter is turned OFF, at which time, the output $V_x$ (OFF) from the wave-peak value detecting circuit 62 is measured and obtained (OFF state measuring process).

Then, the boost converter is turned ON to change the common mode potential (common mode potential changing process). These processes are performed by controlling ON and OFF of the boost converter 16 of the motor/generator driver 10 by a function of the common mode potential change request module via the HVCPU 40. The output $V_x$ (ON) from the wave-peak value detecting circuit 62 is measured with the boost converter turned ON (ON state measuring process).

Then, the output $V_x$ (OFF) from the wave-peak value detecting circuit 62 obtained in the OFF state measuring process is compared with the output $V_x$ (ON) from the wave-peak value detecting circuit 62 obtained in the ON state measuring process (ON/OFF output comparing process). As a result of the comparison, the presence or the absence of a failure is determined depending on whether the $V_x$ (OFF) and $V_x$ (ON) match within a predetermined tolerance (failure determining process). That is, when the $V_x$ (OFF) and the $V_x$ (ON) match within a predetermined tolerance, a failure of an element such as the coupling capacitor is determined.

INDUSTRIAL APPLICABILITY

As shown above, the insulation resistance detection system and apparatus and method according to the present invention are advantageous because an accurate detection of insulation resistance between a DC power supply and a vehicle body is achieved.

The invention claimed is:

1. An insulation resistance detection system comprising:
an insulation resistance drop detecting portion comprising:
a detecting resistor connected in series with an insulating resistor between a DC power supply and a vehicle body;
a coupling capacitor disposed between the insulating resistor and the detecting resistor; and
a pulse oscillating circuit for applying a pulse signal to a series circuit including the insulating resistor, the coupling capacitor, and the detecting resistor;
changing means for changing a common mode potential which is a potential at a junction between the insulating resistor and the coupling capacitor;
a filter applied to a signal at a junction between the coupling capacitor and the detecting resistor to pass the signal within a predetermined frequency range; and
failure determining means for determining a failure of the insulation resistance drop detecting portion based on a comparison result obtained by comparing a change of the filter-applied signal before and after the common mode potential is changed by the changing means.

2. The insulation resistance detection system according to claim 1, wherein the changing means changes the common mode potential by turning an element disposed between the DC power supply and a rotating electric machine ON and OFF, or in accordance with a change in an operation status of the element during an ON period.

3. The insulation resistance detection system according to claim 2,
wherein the DC power supply is connected to a boost or back converter via a system main relay, while the boost or back converter is connected to an inverter which is connected to the rotating electric machine of the vehicle, and
the changing means changes the common mode potential in accordance with a change in an operation status of the boost or back converter during an ON period by turning the boost or back converter ON and OFF.

4. The insulation resistance detection system according to claim 3,
wherein the pulse oscillating circuit provides an oscillation frequency less than $\frac{1}{100}$ of an operating frequency of the boost or back converter and the inverter, and
the filter is a bandpass filter which passes a signal having the oscillation frequency of the pulse oscillating circuit and removes a signal having an operation frequency of the inverter and the boost or back converter.

5. An insulation resistance detection apparatus comprising:
a detecting resistor connected in series with an insulating resistor between a DC power supply for a vehicle and a vehicle body;
a coupling capacitor disposed between the insulating resistor and the detecting resistor;
a pulse oscillating circuit for applying a pulse signal to a series circuit including the insulating resistor, the coupling capacitor, and the detecting resistor;
insulation resistance drop detecting means specify an oscillation condition to the pulse oscillating circuit to detect an insulation resistance drop based on a detected value of a signal at a junction between the coupling capacitor and the detecting resistor;
changing request means for requesting a change in a common mode potential in a vehicle, which is a potential at a junction between the insulating resistor and the coupling capacitor;
a filter applied to a signal at a junction between the coupling capacitor and the detecting resistor to pass the signal within a predetermined frequency range, and
failure determining means for determining a failure of the insulation resistance drop detecting means based on a comparison result obtained by comparing a change of the filter-applied signal before and after the common mode potential is changed.

6. The insulation resistance detection apparatus according to claim 5, wherein the changing request means requests a change in the common mode potential by turning an element disposed between the DC power supply and a rotating electric machine for the vehicle ON and OFF, or in accordance with a change in an operation status of the element during an ON period.

7. The insulation resistance detection apparatus according to claim 6,
wherein the DC power supply is connected to a boost or back converter for the vehicle via a system main relay for the vehicle, while the boost or back converter is connected to an inverter for the vehicle which is connected to the rotating electric machine, and
the changing request means requests a change in the common mode potential in accordance with a change in an operation status of the boost or back converter by turning the boost or back converter ON and OFF.

8. The insulation resistance detection apparatus according to claim 7,
wherein the pulse oscillating circuit provides an oscillation frequency less than $\frac{1}{100}$ of an operating frequency of the boost or back converter and the inverter, and
the filter is a bandpass filter which passes a signal having the oscillation frequency of the pulse oscillating circuit and removes a signal having an operation frequency of the inverter and the boost and back converter.

9. An insulation resistance detection method comprising:
using an insulation resistance drop detecting portion comprising a detecting resistor connected in series with an insulating resistor between a DC power supply for a vehicle and a vehicle body; a coupling capacitor disposed between the insulating resistor and the detecting resistor; and a pulse oscillating circuit for applying a pulse signal to a series circuit including the insulating resistor, the coupling capacitor, and the detecting resistor;

detecting a drop in insulation resistance based on a detected value of a signal at a junction between the coupling capacitor and the detecting resistor by specifying an oscillation condition to the pulse oscillating circuit;

requesting to change a common mode potential in a vehicle, which is a potential at a junction between the insulating resistor and the coupling capacitor; and using a filter being applied to the signal at a junction between the coupling capacitor and the detecting resistor to pass the signal within a predetermined frequency range, and determining a failure of the insulation resistance drop detecting portion based on a comparison result obtained by comparing a change of a filter-applied signal before and after the common mode potential is changed.

10. The method for detecting insulation resistance according to claim 9, wherein the changing request process requests a change the common mode potential by turning an element disposed between the DC power supply and a rotating electric machine for the vehicle ON and OFF, or in accordance with a change in an operation status of the element during an ON period.

11. The method for detecting insulation resistance according to claim 10, wherein the DC power supply is connected to a boost or back converter for the vehicle via a system main relay for the vehicle, while the boost or back converter is connected to an inverter for the vehicle which is connected to the rotating electric machine, and the changing request process requests a change in the common mode potential in accordance with a change in an operation status of the boost or back converter during an ON period by turning the boost or back converter ON and OFF.

12. The method for detecting insulation resistance according to claim 11, wherein the oscillation condition is specified to the pulse oscillating circuit to provide the oscillating frequency less than $1/100$ of an operating frequency of the boost or back converter and the inverter, and the filter is a bandpass filter which passes a signal having the oscillation frequency of the pulse oscillating circuit and removes a signal having an operation frequency of the inverter and the boost and back converter.

* * * * *